United States Patent
Achkire et al.

(10) Patent No.: US 7,364,349 B2
(45) Date of Patent: Apr. 29, 2008

(54) CHEMICAL DILUTION SYSTEM FOR SEMICONDUCTOR DEVICE PROCESSING SYSTEM

(75) Inventors: Younes Achkire, Los Gatos, CA (US); Julia Svirchevski, San Jose, CA (US); Jonathan S. Frankel, San Jose, CA (US); Kien-Bang Lam, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/439,303

(22) Filed: May 22, 2006

(65) Prior Publication Data

US 2006/0211344 A1    Sep. 21, 2006

Related U.S. Application Data

(62) Division of application No. 10/338,249, filed on Jan. 6, 2003, now Pat. No. 7,063,455.

(51) Int. Cl.
*B01F 15/04* (2006.01)
(52) U.S. Cl. .................... 366/152.2; 366/162.1
(58) Field of Classification Search ............ 366/152.1, 366/152.2, 153.1, 160.1, 160.2, 162.1, 162.2
See application file for complete search history.

(56) References Cited

U.S. PATENT DOCUMENTS

| | | | | |
|---|---|---|---|---|
| 3,807,701 A | * | 4/1974 | Reid et al. ............. | 366/132 |
| 3,877,682 A | * | 4/1975 | Moss ...................... | 366/132 |
| 5,288,145 A | * | 2/1994 | Mackey et al. ......... | 366/141 |
| 5,332,311 A | * | 7/1994 | Volk et al. .............. | 366/134 |
| 5,580,168 A | * | 12/1996 | Alireza et al. .......... | 366/153.1 |
| 5,800,056 A | * | 9/1998 | Suzuki et al. ........... | 366/152.4 |
| 6,572,255 B2 | * | 6/2003 | Husher ................... | 366/132 |
| 7,063,455 B2 | * | 6/2006 | Achkire et al. ......... | 366/152.2 |

FOREIGN PATENT DOCUMENTS

| | | | |
|---|---|---|---|
| EP | 0136961 A1 | | 4/1985 |
| GB | 2081119 A | * | 2/1982 |
| JP | 7-198554 | * | 8/1995 |

* cited by examiner

*Primary Examiner*—Charles E. Cooley
(74) *Attorney, Agent, or Firm*—Dugan & Dugan PC

(57) ABSTRACT

A dilution stage is adapted to supply a dilute chemistry to a semiconductor device processing apparatus. The dilution stage includes a first vessel adapted to store the chemistry after dilution and a second vessel adapted to store the chemistry prior to dilution. The dilution stage may also include a control mechanism which is adapted to selectively control flowing of the chemistry and a dilutant to the first vessel. The control mechanism may be operative to fill the second vessel with the chemistry, and to flow the dilutant to the first vessel via the second vessel.

17 Claims, 4 Drawing Sheets

CHEMICAL DILUTION SYSTEM FOR SEMICONDUCTOR DEVICE PROCESSING SYSTEM

CROSS-REFERENCE TO RELATED APPLICATION

This application is a division of U.S. patent application Ser. No. 10/338,249 filed Jan. 6, 2003 and issued as U.S. Pat. No. 7,063,455 on Jun. 20, 2006, which is incorporated by reference herein in its entirety.

FIELD OF THE INVENTION

The present invention is concerned with semiconductor device manufacturing, and is more particularly concerned with apparatus and methods for diluting a chemical used in connection with semiconductor device manufacturing.

BACKGROUND OF THE INVENTION

Processes for forming semiconductor devices on a substrate such as a silicon wafer often include one or more steps referred to as "planarization". During planarization, a substrate is polished using a slurry in order to remove a top layer of material from the substrate and/or to produce a smooth uniform surface on the substrate. After planarization, it is customary to clean the substrate in a conventional cleaning device such as a megasonic cleaning tank.

It has been proposed to use a highly dilute surfactant solution as a fluid in a megasonic cleaning tank and/or as a fluid that is occasionally introduced into the megasonic tank as a "spike" to compensate for fluid loss due to evaporation or the like. However, conventional dilution apparatuses, in which a chemistry to be diluted and a dilutant are simultaneously flowed into a storage tank, may not operate with sufficient precision to reliably bring about a desired degree of dilution.

SUMMARY OF THE INVENTION

In a first aspect of the invention, an inventive dilution stage is provided that includes a storage vessel adapted to store a dilute chemistry and a fixed volume vessel. The fixed volume vessel is adapted to receive a chemistry to be diluted, store a fixed volume of the chemistry prior to dilution, and deliver the fixed volume of chemistry to the storage vessel. The inventive dilution stage further includes a flow controller adapted to receive a flow of dilutant and to supply the dilutant to the storage vessel through the fixed volume vessel at a flow rate. The inventive dilution stage further includes a controller coupled to the flow controller and programmed to determine a dilution ratio for the storage vessel and to direct delivery of chemistry to the fixed volume vessel so as to fill the fixed volume vessel with the chemistry. The controller is further programmed to determine a volume of dilutant to deliver to the storage vessel through the fixed volume vessel to achieve the dilution ratio, and to direct delivery of the volume of dilutant to the storage vessel through the fixed volume vessel. As is understood by those who are skilled in the art, "chemistry" or "a chemistry" refers to any chemical substance, solution and/or mixture.

Numerous other aspects are provided, as are methods, apparatus and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

The apparatus and methods of the present invention are well suited to precisely provide a highly dilute chemistry (e.g., a surfactant or other chemical) to a semiconductor device processing apparatus (e.g., a megasonic cleaning tank or the like). In addition, the inventive apparatus and methods can be provided cost effectively, and can be arranged to selectively operate in a non-diluting mode of operation.

Other objects, features and advantages of the present invention will become more fully apparent from the following detailed description of exemplary embodiments, the appended claims and the accompanying drawings.

DETAILED DESCRIPTION

The present invention provides for a fixed volume connected between a chemistry supply and a storage vessel. An appropriate amount of chemistry may be precisely stored in the fixed volume and then a dilutant may be flowed through the fixed volume, carrying the chemistry therewith to the storage vessel. The amount of dilutant flowed through the fixed volume to the storage vessel may be controlled by a flow controller and may be determined by a period of time that the dilutant is permitted to flow. In this manner, dilution of the chemistry may be precisely controlled. The dilute chemistry in the storage vessel optionally may be further diluted at a second dilution stage, and provided to a semiconductor device processing apparatus such as a megasonic tank.

Figure 1:
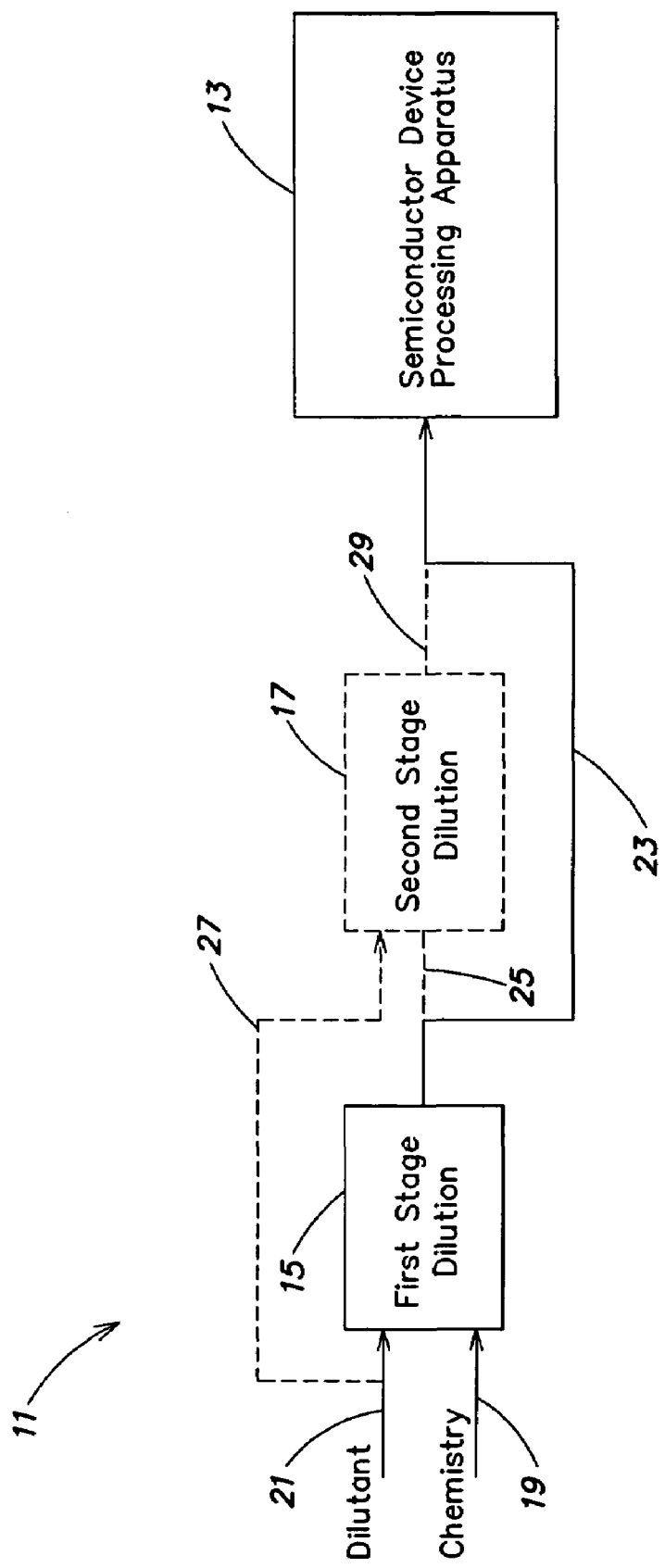
FIG. 1 is a high level block diagram of a semiconductor device processing system provided in accordance with the invention.

FIG. 1 is a high level block diagram of a semiconductor device processing system 11 provided in accordance with the present invention. The inventive semiconductor device processing system 11 includes a semiconductor device processing apparatus 13, which may be, for example, a conventional megasonic cleaning tank. Alternatively, the semiconductor device processing apparatus 13 may be another type of cleaning device, a spin-rinse-dryer, or a polisher. Other types of semiconductor device processing apparatuses that employ a dilute chemistry also may be employed.

The semiconductor device processing system 11 also includes a first dilution stage 15, which is provided in accordance with the present invention, and of which embodiments are described below. The semiconductor device processing system 11 may also include a second dilution stage 17 (shown in phantom) which may be coupled between the first dilution stage 15 and the semiconductor device processing apparatus 13.

The first dilution stage 15 is adapted to couple to a source of chemistry via a first line 19, and is adapted to couple to a source of dilutant via a second line 21. The first dilution stage 15 may output a dilute chemistry directly to the semiconductor device processing apparatus 13, as indicated by path 23. Alternatively, the second dilution stage 17, if present, may be coupled to the first dilution stage 15 via a third line 25 (shown in phantom). The second dilution stage 17 is also adapted to couple to the source of dilutant via a fourth line 27 (shown in phantom). If the second dilution stage 17 is present, it may be coupled to the semiconductor device processing apparatus 13 via a fifth line 29 (shown in phantom) through which a further-diluted chemistry output from the second dilution stage 17 may flow to the semiconductor device processing apparatus 13.

The second dilution stage 17 may be provided, for example, in accordance with conventional practices. For instance, the second dilution stage 17 may provide a flow of dilutant from the fourth line 27 at a first flow rate, and may provide a flow of dilute chemistry from the first dilution stage 15 at a second flow rate so as to establish a predetermined ratio between the first and second flow rates. Alternatively, the second dilution stage 17 may be provided in accordance with the present invention as described further below with reference to the first dilution stage 15.

Figure 2:
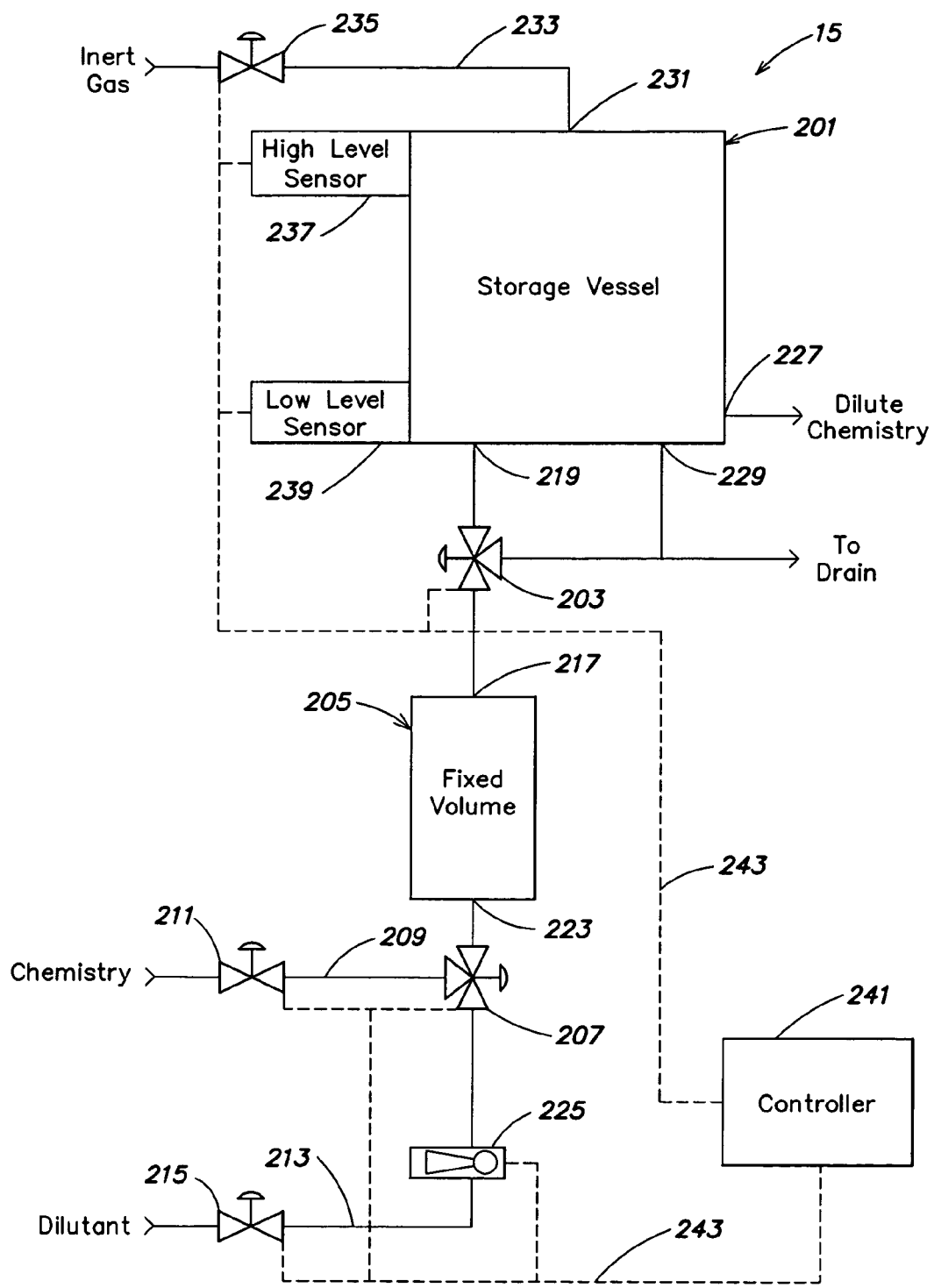
FIG. 2 is a schematic block diagram of a generalized embodiment of a first dilution stage included in the system of FIG. 1.

FIG. 2 is a schematic block diagram of a generalized embodiment of the first dilution stage 15. The first dilution stage 15 includes a storage vessel 201 (which may also be considered a "first vessel"). The storage vessel 201 may be selectively coupled to a source of chemistry via a first valve 203, a fixed volume vessel 205 (which may also be considered a "second vessel"), a second valve 207, a chemistry supply line 209 and a third valve 211. The storage vessel 201 also may be selectively coupled to a source of dilutant via the first valve 203, the fixed volume vessel 205, the second valve 207, a dilutant supply line 213 and a fourth valve 215.

The first valve 203 is connected between an outlet 217 of the fixed volume vessel 205 and an inlet 219 of the storage vessel 201. The first valve 203 is a 3-way valve, as indicated in FIG. 2, and is also coupled to a drain line 221. The first valve 203 is switchable between a first condition in which the first valve 203 couples the outlet 217 of the fixed volume vessel 205 to the inlet 219 of the storage vessel 201 (thereby permitting fluid to flow from the fixed volume vessel 205 to the storage vessel 201), and a second condition in which the first valve 203 couples the outlet 217 of the fixed volume vessel 205 to the drain line 221 (thereby permitting fluid to flow from the fixed volume vessel to 205 to a drain (not shown)).

The second valve 207 is also a 3-way valve and is connected to an inlet 223 of the fixed volume vessel 205 and is switchable between a first condition in which the second valve 207 couples the inlet 223 of the fixed volume vessel 205 to the chemistry supply line 209 (thereby allowing fluid to flow from a chemistry supply (not shown) through the chemistry supply line 209 to the fixed volume vessel 205) and a second condition in which the second valve 207 couples the inlet 223 of the fixed volume vessel 205 to the dilutant supply line 213 (thereby allowing fluid to flow from a dilutant source (not shown) through the dilutant supply line 213 to the fixed volume vessel 205).

The third valve 211 is connected to the chemistry supply line 209 and is adapted to selectively allow chemistry to flow in the chemistry supply line 209. The fourth valve 215 is connected to the dilutant supply line 213 and is adapted to selectively allow dilutant to flow in the dilutant supply line 213. The valves 203, 207, 211 and 215 may each comprise any conventional valve such as a pneumatically or electrically controllable valve.

As shown in FIG. 2, the dilutant supply line 213 includes a flow controller 225. The flow controller 225 may be, for example, a conventional flow control device such as a mass flow controller, a needle valve, or any other type of flow meter and/or regulator, and is provided to control a rate at which dilutant flows through the dilutant supply line 213 to the fixed volume vessel 205.

Although the fixed volume vessel 205 is shown as a separate block for purposes of illustration in FIG. 2, in practice, the fixed volume vessel 205 may comprise a known length of fluid supply line of known inner diameter, extending between the first valve 203 and the second valve 207 or any other fixed volume vessel that is adapted to store or contain a fluid. The fixed volume vessel may include more than one storage unit. The fixed volume vessel also may have an adjustable interior volume (e.g., adjustable via a moveable piston, diaphragm, bellows, etc., that may be moved to increase or decrease the interior volume of the vessel prior to dilution), although the volume of the fixed volume vessel is preferably fixed during dilution.

The storage vessel 201 may comprise any suitable vessel that is adapted to store or contain a fluid. The storage vessel 201 may include, in addition to the above-mentioned inlet 219, an outlet 227 through which dilute chemistry stored in the storage vessel 201 may flow to the second dilution stage 17 (FIG. 1, if present) or to the semiconductor device processing apparatus 13 (e.g., via path 23 of FIG. 1). A valve, which is not shown, may be provided at or downstream from the outlet 227 to control flow of dilute chemistry from the storage vessel 201.

The storage vessel 201 may also include a drain outlet 229 via which the storage vessel 201 may be drained. Again, a valve, which is not shown, may be provided at or downstream from the drain outlet 229 to control draining of the storage vessel 201.

The storage vessel 201 also includes a gas inlet 231 coupled via a gas supply line 233 and a gas valve 235 to a source of gas (not shown). As described further below, the gas valve 235 allows the storage vessel 201 to be selectively pressurized by allowing gas to selectively flow under pressure into the storage vessel 201 via the gas inlet 231. The pressurized gas may be, for example, nitrogen or any other suitable gas. The gas valve 235 may comprise any conventional gas valve such as a pneumatically or electrically controllable gas valve.

In accordance with conventional practice, a high level sensor 237 and a low level sensor 239 may be associated with the storage vessel 201. As is familiar to those who are skilled in the art, the high level sensor 237 may output a detection signal to indicate that fluid in the storage vessel 201 has reached, or is at or exceeds, a pre-determined high level. Accordingly, the high level sensor 237 may aid in preventing overfilling of the storage vessel 201.

The low level sensor 239 may output a detection signal to indicate that fluid in the storage vessel 201 has been depleted to, or is at or below, a predetermined low level. Accordingly, the low level sensor 239 may aid in determining when the storage vessel 201 needs to be refilled and/or in determining when an operation to drain the storage vessel 201 has been completed. The low level sensor 239 may also aid in preventing unintentional draining of the storage vessel 201. More than one high level and/or low level sensor may be employed as may any conventional level sensor.

The first dilution stage 15 may include a controller 241 coupled to the first valve 203, the second valve 207, the third valve 211, the fourth valve 215, the flow controller 225, the gas valve 235, the high level sensor 237 and/or the low level sensor 239 (e.g., via signal paths 243). The controller 241 is adapted to receive detection signals output from the high level sensor 237 and the low level sensor 239, and is also adapted to control the valves 203, 207, 211, 215 and/or the flow controller 225. Other valves, which are not shown, may be coupled to, and controlled by the controller 241 (e.g., valves that control flow of fluid from the storage vessel 201). The controller 241 may comprise any suitable hardware, software or combination thereof such as one or more appropriately programmed microprocessors or microcontrollers, dedicated logic circuits, or the like.

Figure 3:
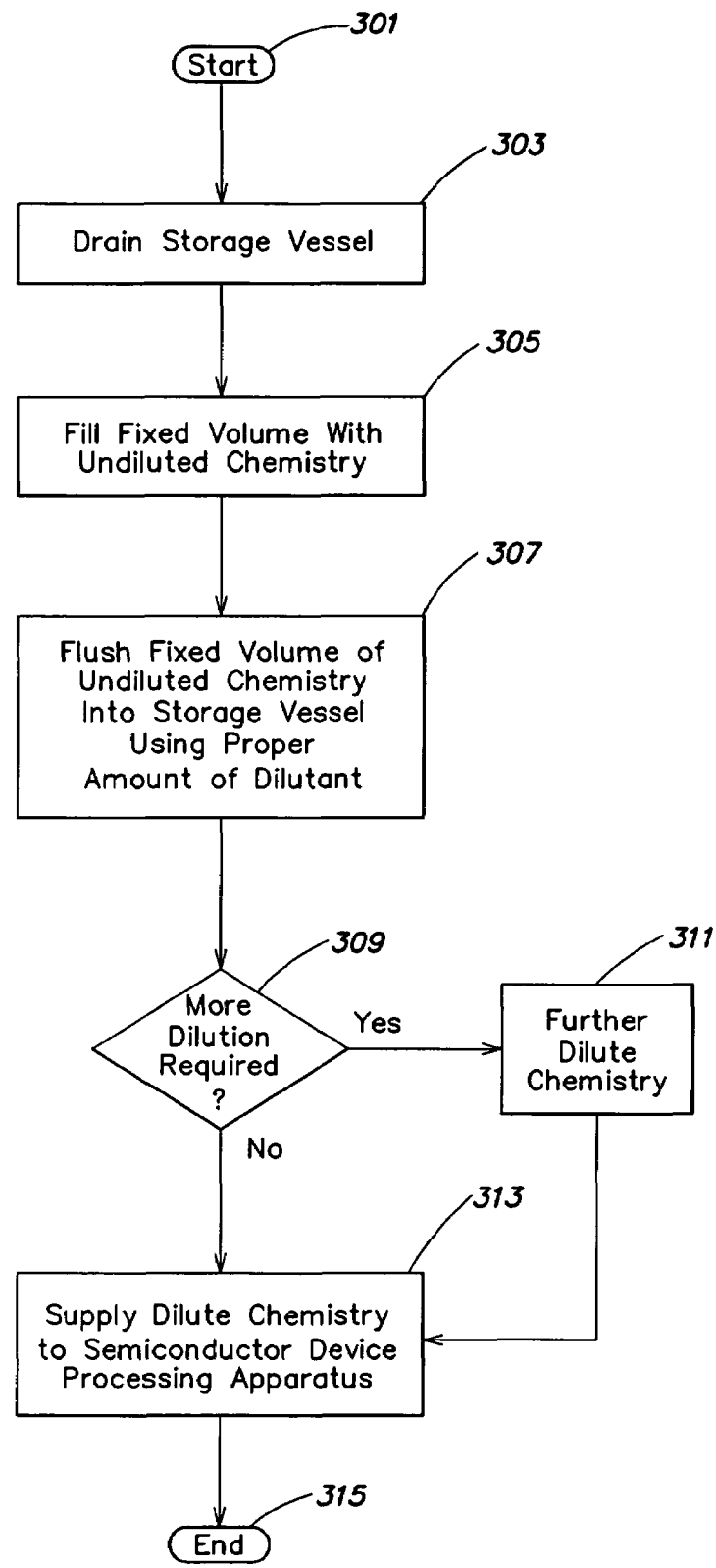
FIG. 3 is a flow chart that illustrates an inventive process performed by the system of FIG. 1.

FIG. 3 is a flow chart that illustrates a chemistry dilution process that may be carried out in accordance with the invention by the semiconductor device processing system 11 of FIG. 1. The process of FIG. 3 starts at step 301 and proceeds to step 303, at which the storage vessel 201 (FIG. 2) is drained (e.g., by opening a valve (not shown) that connects the storage vessel 201 to the drain). Draining may be assisted/expedited by opening the gas valve 235 to pressurize the storage vessel 201 with inert gas. A fully drained condition of the storage vessel 201 may be detected, for example, via the low level sensor 239.

Following step 303 is step 305, at which the fixed volume vessel 205 is filled with undiluted chemistry from a source of chemistry (not shown). Step 305 may include opening the third valve 211, placing the second valve 207 in a condition to allow fluid communication between the chemistry supply line 209 and the fixed volume vessel 205, and placing the first valve 203 in a condition to allow fluid communication between the fixed volume vessel 205 and the drain line 221. Chemistry then is allowed to flow through the chemistry supply line 209 and the fixed volume vessel 205 and into the drain (not shown) via drain line 221 for a predetermined period of time to purge any residual fluid (e.g., residual dilutant from a previously performed dilution process) from the fixed volume vessel 205 and/or to completely fill the fixed volume vessel 205 with undiluted chemistry. The flow of the chemistry is stopped by closing the third valve 211. As used herein, an undiluted chemistry that is to be diluted in accordance with the present invention may include one or more partially diluted chemicals or one or more fully concentrated chemicals that require further dilution.

Following step 305 is step 307. At step 307 dilutant is flowed through the fixed volume vessel 205 to the storage vessel 201. This may be accomplished by placing the first valve 203 in a condition such that the fixed volume vessel 205 is in fluid communication with the storage vessel 201, placing the second valve 207 in a condition such that the dilutant supply line 213 is in fluid communication with the fixed volume vessel 205, and opening the fourth valve 215. Dilutant then flows through the dilutant supply line 213 through the fixed volume vessel 205 to the storage vessel 201, carrying with it the chemistry which had been stored in the fixed volume vessel 205 at step 305. The rate at which the dilutant flows in the dilutant supply line 213 is controlled/set by the flow controller 225 (e.g., under the control of the controller 241). The controller 241 may control the fourth valve 215 so that dilutant is allowed to flow for a predetermined period of time, at the flow rate set by the flow controller 225, so that a predetermined quantity of dilutant is delivered to the storage vessel 201, thereby providing a predetermined degree of dilution to the chemistry that had been stored in the fixed volume vessel 205.

Upon completion of step 307, the dilute chemistry is stored in the storage vessel 201. Following step 307 is a decision block 309, at which it is determined whether further dilution is to be performed with respect to the dilute chemistry stored in the storage vessel 201. If so, step 311 follows. At step 311 the dilute chemistry stored in the storage vessel 201 is flowed from the storage vessel 201/first dilution stage 15 (FIG. 2 and FIG. 1) to the second dilution stage 17 (FIG. 1) at which further dilution is applied to the dilute chemistry by means of dilutant flowed through the fourth line 27 of the semiconductor device processing system 11 (FIG. 1) to the second dilution stage 17. Alternatively, a dilution process similar to that of steps 303-307 may be employed to further dilute the dilute chemistry stored in the storage vessel 201. The further diluted chemistry is then supplied to the semiconductor device processing apparatus 13 of FIG. 1 (step 313, FIG. 3) and the process of FIG. 3 ends at step 315.

If a negative determination is made at decision block 309, then the dilute chemistry stored in the storage vessel 201 (FIG. 2) is supplied directly from the storage vessel 201/first dilution stage 15 to the semiconductor device processing apparatus 13 of FIG. 1 (step 313, FIG. 3) and the process of FIG. 3 ends at step 315.

Dilute chemistry may be flowed from the storage vessel 201, for example, by opening the gas valve 235 so that gas flows into and pressurizes the storage vessel 201 (via the gas supply line 233 and the gas inlet 231 of the storage vessel 201). Pressurizing the storage vessel 201 thereby forces the dilute chemistry stored therein to flow out of the outlet 227 of the storage vessel 201.

The controller 241 may be programmed or otherwise adapted to perform one or more of steps 301-315. For example, one or more of steps 301-315 may comprise one or more computer program products.

Figure 4:
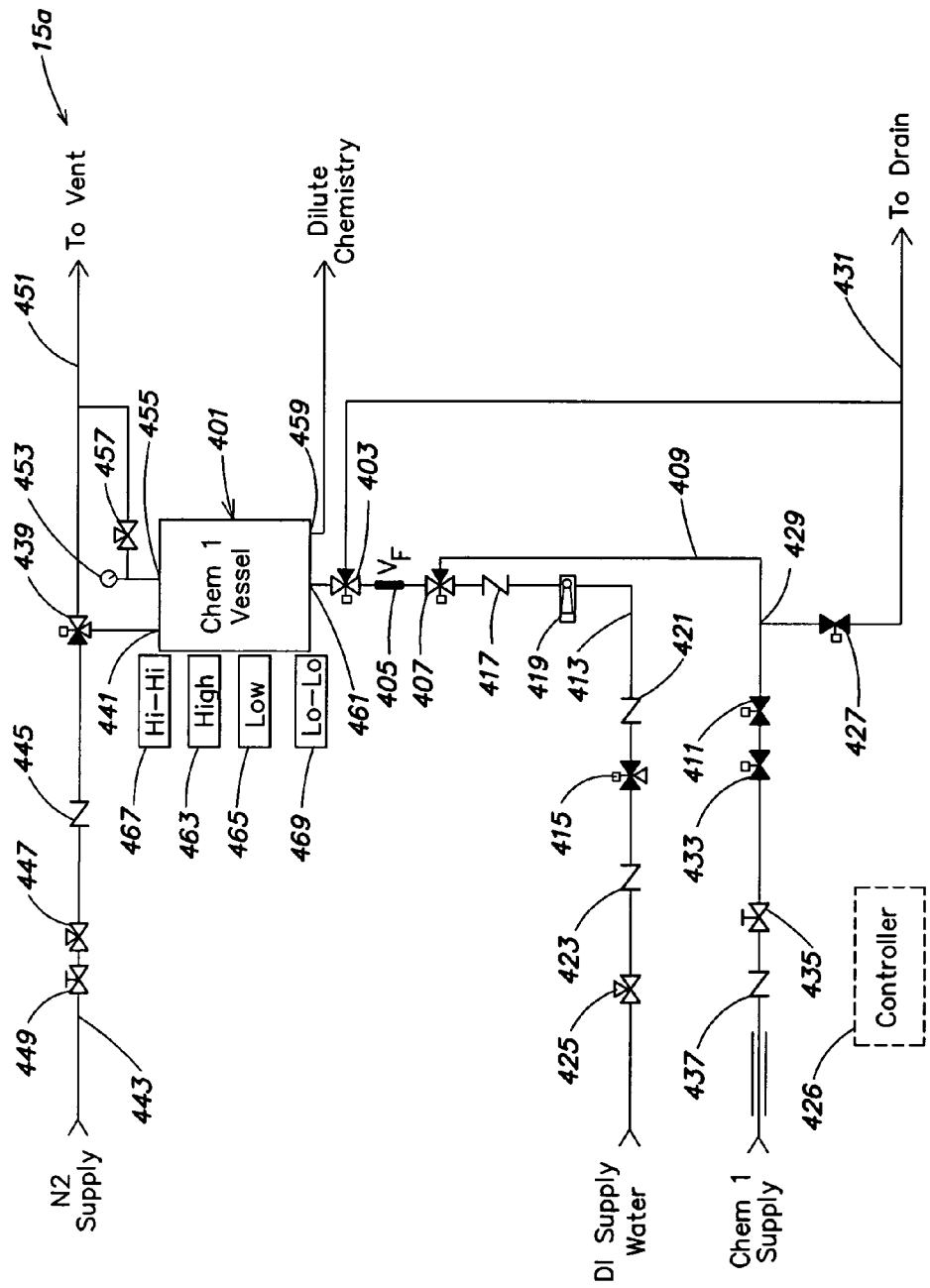
FIG. 4 is a schematic block diagram of an alternative embodiment of the dilution stage of FIG. 2.

FIG. 4 is a schematic block diagram of an alternative embodiment of the first dilution stage 15 of FIG. 2. In FIG. 4, reference numeral 15a generally indicates the first dilution stage provided in accordance with the alternative embodiment. The alternative first dilution stage 15a includes a storage vessel 401 which may generally correspond to the storage vessel 201 shown in FIG. 2. The alternative first dilution stage 15a also includes a first valve 403 which may correspond to the first valve 203 of FIG. 2, a fixed volume vessel 405 which may correspond to the fixed volume vessel 205 of FIG. 2, and a second valve 407, which may correspond to the second valve 207 of FIG. 2.

A chemistry supply line 409 is connected to the second valve 407 and has installed thereon a third valve 411, which may correspond to the third valve 211 of FIG. 2. A dilutant supply line 413 also is connected to the second valve 407, and has installed thereon a fourth valve 415, which may correspond to the fourth valve 215 of FIG. 2.

Continuing to refer to the dilutant supply line 413 shown in FIG. 4, a first check valve 417 is provided upstream from the second valve 407 to prevent fluid from flowing backward from the second valve 407 into the dilutant supply line 413. A flow controller 419 is provided upstream from the first check valve 417, and may correspond to the flow controller 225 of FIG. 2.

A second check valve 421 is provided upstream from the flow controller 419 and downstream from the fourth valve 415. A third check valve 423 is provided upstream from the fourth valve 415. Other numbers of check valves may be employed (e.g., 0-2, more than three, etc.). An optional pressure regulator 425 is shown coupled to the dilutant supply line 413 upstream from the third check valve 423. The pressure regulator 425 may be controlled (e.g., by a controller 426 (shown in phantom) that may be similar to the controller 241 of FIG. 2) to vary a pressure of dilutant in the dilutant supply line 413.

A fifth valve 427 may be provided to selectively couple the chemistry supply line 409 to a drain line 431 (e.g., via a junction 429). The junction 429 may be positioned, for example, on the chemistry supply line 409 between the second valve 407 and the third valve 411.

A sixth valve 433 (e.g., an optional, redundant valve for safety purposes in case the third valve 411 fails) may be provided upstream from the third valve 411, and an optional manual valve 435 is provided upstream from the sixth valve 433 (e.g., for use when coupling a new chemistry supply to the chemistry supply line 409). A fourth check valve 437 may be provided upstream from the manual valve 435 to prevent fluid from flowing toward a chemistry supply (not shown) coupled to the chemistry supply line 409.

As further shown in FIG. 4, a gas valve 439 is connected to a gas port 441 of the storage vessel 401. The gas valve 439 is connected via a gas line 443 to a pressurized gas supply (e.g., pressurized nitrogen or another inert gas). A fifth check valve 445, a gas pressure regulator 447, and/or a manual gas valve 449 may be provided upstream from the gas valve 439 (as shown). The gas pressure regulator 447 may be controlled by a controller (e.g., the controller 426) to vary a pressure in the gas line 443. The gas valve 439 also may be connected to a vent via a vent line 451.

In the embodiment of FIG. 4, a pressure sensor 453 is shown coupled to a pressure sense port 455 of the storage vessel 401. The pressure sensor 453, if present, may be coupled to the controller 426 to allow the controller to monitor a pressure level in the storage vessel 401. A feedback loop including the pressure sensor 453 and the controller 426 may operate to maintain a predetermined pressure level in the storage vessel 401 by, for example, varying a rate of gas flow to the gas port 441 of the storage vessel 401 from the gas line 443. An optional pressure relief valve 457 is shown connected between the vent line 451 and the pressure sense port 455 of the storage vessel 401, and may operate to vent gas from the storage vessel 401 when necessary to prevent an excessive pressure level from building in the storage vessel 40.

The storage vessel 401 includes a fluid outlet 459 through which dilute chemistry may be flowed to the second dilution stage 17 (FIG. 1) or to the semiconductor device processing apparatus 13, as the case may be, under pressure from the pressurized gas applied to the storage vessel 401 via the gas port 441. The storage vessel 401 also includes a fluid inlet 461, through which chemistry and dilutant may flow into the storage vessel 401, and, as will be described, via which the storage vessel 401 may be drained. The storage vessel 401 may also include a separate drain outlet (not shown) which may be coupled to the drain line 431 and which may be controlled via a drain valve which is not shown. It should be understood that a valve (not shown) may also be provided at or downstream from the fluid outlet 459, to control dispensing of dilute chemistry from the storage vessel 401.

A high level sensor 463 is associated with the storage vessel 401 and may correspond to the high level sensor 237 shown in FIG. 2. A low level sensor 465 is also associated with the storage vessel 401 and may correspond to the low level sensor 239 shown in FIG. 2. In addition, a "high-high" sensor 467 is associated with the storage vessel 401 to detect a higher fluid level than that detected by the high level sensor 463. Also, a "low-low" level sensor 469 is associated with the storage vessel 401 to detect a lower fluid level than that detected by the low level sensor 465.

In at least one embodiment of the invention, the valves 411, 415, 427 and 433 are configured to be closed when not energized, and open only when energized (e.g., by the controller 426). The first valve 403 is configured so that, when in an unenergized condition, the fixed volume vessel 405 is in fluid communication with the storage vessel 401, and when the first valve 403 is in an energized condition, the fixed volume vessel 405 is in fluid communication with the drain line 431. The second valve 407 is configured such that, when in an unenergized condition, the dilutant supply line 413 is in fluid communication with the fixed volume vessel 405, and when the second valve 407 is in an energized condition, the chemistry supply line 409 is in communication with the fixed volume vessel 405. The gas valve 439 is configured such that when in an unenergized condition, the gas line 443 is in fluid communication with the vent line 451, and when the gas valve 439 is in an energized condition, the gas line 443 is in communication with the gas port 441 of the storage vessel 401. Other valve configurations may be employed.

It will also be understood that the controller 426, may be coupled to and control one or more of the valves 403, 407, 411, 415, 427, 433 and 439, the flow controller 419, and the sensors 453, 463, 465, 467 and 469. The controller 426 and the above valves thereby may form a control mechanism that controls the flow of fluids in the first dilution stage 15a of FIG. 4. Any suitable valves, sensors and flow controllers may be employed.

Certain operations of the first dilution stage 15a of FIG. 4 will now be described. All manual valves will be assumed to be in an open condition. The controller 426 may be configured to perform or initiate any of the steps of any of the below listed operations (e.g., through appropriate logic circuitry and/or computer code).

As a first example, when the storage vessel 401 is to be drained, the following steps may be performed:

(a) the gas valve 439 is energized (by the controller 426) so that pressurized gas (e.g., nitrogen) is provided to the storage vessel 401, thereby creating pressure in the storage vessel 401 that tends to force chemistry stored in the vessel 401 out of the vessel 401;

(b) the second valve 407 and the fifth valve 427 are energized (by the controller 426), thereby creating a fluid flow path from the storage vessel 401 to the drain line 431 through the first valve 403, (which is unenergized), the fixed volume vessel 405, the second valve 407 and the fifth valve 427; the third valve 411 and the sixth valve 433 (if present) are closed; under pressure from the gas introduced into the storage vessel 401 via the gas port 441, any fluid in the storage vessel 401 is drained via the drain line 431;

(c) the controller 426 waits for the low-low level sensor 469 to provide an output signal to the controller 426;

(d) the controller 426 may wait an additional time period, such as about ten seconds to assure complete draining of the storage vessel 401;

(e) the controller 426 deenergizes the fifth valve 427, thereby closing the fifth valve 427 (e.g., closing the path from the storage vessel 401 to the drain line 431);

(f) the controller 426 deenergizes the gas valve 439, thereby removing the flow of gas to the storage vessel 401 and allowing the storage vessel 401 to vent via the gas port 441 and the vent line 451; and (g) the controller 426 deenergizes the second valve 407, thereby closing the fluid flow path between the fixed volume vessel 405 and the chemistry supply line 409 and opening a fluid flow path between the fixed volume vessel 405 and the dilutant supply line 413.

It should be noted that step (g) may be omitted if filling of the storage vessel 401 (in a procedure to be described immediately below) is to follow draining of the storage vessel.

An operation for filling the storage vessel 401 with dilute chemistry in accordance with the invention will now be described.

The following pre-steps may be performed to drain the storage vessel 401 if the storage vessel 401 has not already been drained:

Pre-step (i)—energize gas valve 439 to supply pressurized gas to the storage vessel 401;

Pre-step (ii)—energize the second valve 407 and the fifth valve 427 to drain the storage vessel 401;

Pre-step (iii)—wait for the low level sensor 465 to output a low-level detection signal; and Pre-step (iv)—deenergize the fifth valve 427 and the gas valve 439.

Assuming that the storage vessel 401 has been drained, the following steps may be performed to fill the storage vessel 401 with dilute chemistry:

(a) if not already energized, energize the second valve 407 to form a fluid flow path between the fixed volume vessel 405 and the chemistry supply line 409;

(b) energize the first valve 403 to form a fluid flow path from the fixed volume vessel 405 to the drain line 431;

(c) energize the third valve 411 and the sixth valve 433 to flow chemistry to the fixed volume vessel 405; during this step, chemistry is flowed through the fixed volume vessel 405 so as to over flow the fixed volume vessel 405 into the drain, thereby flushing residual chemistry and/or dilutant from the fixed volume vessel 405;

(d) wait for a predetermined time period (e.g., about seven seconds) to complete the flushing and filling with chemistry of the fixed volume vessel 405;

(e) deenergize the third valve 411 and the sixth valve 433 to halt the flow of chemistry to the fixed volume vessel 405;

(f) deenergize the first valve 403 and the second valve 407; (steps (e) and (f) may be combined or interchanged in order);

(g) energize the fourth valve 415 to flow dilutant to and through the fixed volume vessel 405 and into the storage vessel 401, thereby flushing the chemistry that had been stored in the fixed volume vessel 405 into the storage vessel 401, and thereby diluting the chemistry; and (h) wait a suitable time period $T_d$ so as to dilute the chemistry by a predetermined factor (dilution ratio R); the waiting time $T_d$ for this step may be calculated according to the formula $T_d=V_x(R \div Q)$, where V is the volume of the fixed volume vessel 405, Q is the rate of flow of the dilutant in the dilutant supply line 413 (governed by the flow controller 419) and R, as noted above, is the dilution ratio to be provided by the first dilution stage 15a.

Upon completion of the waiting time $T_d$, the following (final) step may be performed:

(i) deenergize the fourth valve 415 to stop the flow of dilutant to the fixed volume vessel 405.

It will be understood that the controller 426 may be configured to determine the dilution ratio R and the time period $T_d$ required to achieve the dilution ratio R. For example, a user may input the desired dilution ratio R, and based on the flow rate Q of dilutant in the dilutant supply line 413, the controller 426 may determine the time period $T_d$. Likewise, these and the other operations described herein may be performed manually.

EXAMPLE A

In one embodiment of the invention, the chemistry to be diluted may be a surfactant. Other chemistries may be similarly diluted (e.g., acids, bases, etc.). The dilutant may be deionized water, although other dilutants may be employed (e.g., ammonium hydroxide or some other known cleaning chemistry). In one particular embodiment, the desired dilution ratio R at the first dilution stage 15a may be about 200. Assuming the volume V of the fixed volume vessel 405 is about 5 cc, the volume of the storage vessel 401 is about 1000 cc or larger, and the rate at which the dilutant is flowed through the dilutant supply line 413 during step (h) is about 1000 cc/min, the waiting time $T_d$ during which dilutant is flowed through the fixed volume vessel 405 into the storage vessel 401 is about 60 seconds. Other fixed volume vessel and storage vessel volumes, and flow rates may be employed. Other dilution ratios may be provided.

In one embodiment, the dilutant supply line 413 may be a ⅜ inch outer diameter supply line, and the chemical supply line 409 may be a ¼ inch outer diameter supply line. Other dimensions may be employed.

In at least one embodiment of the invention, a further dilution by a factor in the range of about 1:16 may be provided at the second dilution stage 17, so that chemistry diluted in the range of 1:1200 to 1:3200 may be provided to the semiconductor device processing apparatus 13. For example, chemistry diluted at 1:200 may be employed for initial filling of a megasonic cleaner tank and chemistry diluted at 1:3200 may employed for bath replenishment. Other dilution ratios may be employed.

Dilute chemistry provided in accordance with this example may be suitable, for example, for megasonic cleaning of a semiconductor wafer having a tungsten or other similar film formed thereon.

It will be appreciated that the dilution apparatus disclosed herein allows for precise measurement of the volume of chemistry to be supplied for dilution. Consequently, the degree of dilution to be provided by the dilution apparatus may be set with greater precision and repeatability than was possible with prior art techniques. Moreover, the dilution apparatus disclosed herein may be provided at relatively low cost.

The present invention also accommodates operation with chemistry that is not to be diluted. For example, it may be desirable to provided a hydrogen peroxide or other solution to a megasonic cleaning tank for cleaning a semiconductor wafer on which an oxide (e.g., a shallow trench isolation (STI) layer or a polysilicon layer) or other layer has been formed. To operate the first dilution stage 15a of FIG. 4 in a non-dilution mode, the following steps may be performed (assuming that the storage vessel 401 has already been drained and/or flushed):

a) deenergize the gas valve 439 to depressurize and vent the storage vessel 401;

b) energize the second valve 407 to provide a flow path between the chemistry supply line 409 and the fixed volume vessel 405;

c) verify that the first valve 403 is de-energized so that a flow path is present between the fixed volume vessel 405 and the storage vessel 401;

d) energize the third valve 411 and the sixth valve 433 to flow chemistry to the storage vessel 401 via the fixed volume vessel 405;

e) wait until the high level sensor 463 generates a high level signal (indicating that the storage vessel 401 is full); and f) deenergize the second valve 407, the third valve 411 and the sixth valve 433 to halt the flow of chemistry to the storage vessel 401.

It should be understood that the controller 241 (FIG. 2) and/or the controller 426 (FIG. 4) may be programmed to perform the methods and employ the algorithms disclosed herein. Each controller may include one or more computer program products that are so programmed in a computer readable medium, including, for example, a carrier wave signal, a floppy disk, a hard drive, a random access memory, etc.

The foregoing description discloses only exemplary embodiments of the invention; modifications of the above disclosed apparatus and methods which fall within the scope of the invention will be readily apparent to those of ordinary skill in the art. For instance, valve configurations other than those illustrated herein may be employed.

As noted before, the second dilution stage referred to herein need not be employed. Also, other dilution ratios than those described herein may be employed. Furthermore, the inventive dilution apparatus may be utilized with semiconductor device processing apparatus other than megasonic cleaning tanks. For example, the invention may be used with polishers and/or spin-rinse-dryers.

Other line pressures and/or dimensions than those referred to in Example A may be provided, as may the respective volumes of the fixed volume vessel 405 and the storage vessel 401. Moreover, the vessel 405 may be configured in a manner such that the volume thereof may be changed manually and/or automatically. For example, a suitable piston and/or valve arrangement may be provided in conjunction with the fixed volume vessel 405.

Accordingly, while the present invention has been disclosed in connection with exemplary embodiments thereof, it should be understood that other embodiments may fall within the spirit and scope of the invention, as defined by the following claims.

The invention claimed is:

1. A method of diluting a chemistry with dilutant, comprising:
   providing a first vessel and a second vessel selectively coupled to provide a flow of fluid to the first vessel;
   filling the second vessel with the chemistry;
   determining a flow time for the dilutant to the first vessel; and
   flowing the dilutant to the first vessel via the second vessel for the determined flow time so as to dilute the chemistry.

2. The method of claim 1, wherein the filling step includes overflowing the chemistry from the second vessel to a drain.

3. The method of claim 1, further comprising draining the first vessel prior to the filling step.

4. The method of claim 3, wherein the draining step includes draining the first vessel at least partially via the second vessel.

5. The method of claim 1, wherein the flowing step includes flowing a quantity of dilutant that is more than 100 times a volume of the second vessel to the first vessel.

6. The method of claim 5, wherein the flowing step includes flowing a quantity of dilutant that is substantially 200 times the volume of the second vessel to the first vessel.

7. A method comprising:
   providing a storage vessel adapted to store a dilute chemistry;
   providing a fixed volume vessel adapted to:
      receive a chemistry to be diluted;
      store a fixed volume of the chemistry prior to dilution; and
      deliver the fixed volume chemistry to the storage vessel;
   determining a dilution ratio for the storage vessel;
   directing delivery of chemistry to the fixed volume vessel so as to fill the fixed volume vessel with the chemistry;
   determining a volume of dilutant to deliver to the storage vessel through the fixed volume vessel to achieve the dilution ratio, wherein the volume determination comprises determining a flow time for the dilutant into the fixed volume vessel; and
   directing delivery of the volume of dilutant to the storage vessel through the fixed volume vessel for the flow time.

8. The method of claim 7 wherein:
   determining the flow time for the dilutant into the fixed volume vessel is based on the flow rate of the dilutant so as to achieve the dilution ratio; and
   directing delivery of the volume of dilutant to the storage vessel through the fixed volume vessel comprises directing a flow of the dilutant to the storage vessel through the fixed volume vessel at the flow rate for the flow time.

9. The method of claim 7 further comprising draining the storage vessel before delivery of chemistry to the fixed volume vessel.

10. The method of claim 9 further comprising at least partially draining the storage vessel through the fixed volume vessel.

11. The method of claim 7 wherein the chemistry includes a surfactant.

12. The method of claim 11 wherein the dilutant includes deionized water.

13. The method of claim 7 wherein directing delivery of chemistry to the fixed volume vessel so as to fill the fixed volume vessel with the chemistry comprises overflowing the chemistry from the fixed volume vessel to a drain.

14. A method comprising:
   providing a fixed volume vessel adapted to:
      receive a chemistry to be diluted;
      store a fixed volume of the chemistry prior to dilution; and
      deliver the fixed volume chemistry to a storage vessel;
   determining a dilution ratio for the storage vessel;
   directing delivery of chemistry to the fixed volume vessel so as to fill the fixed volume vessel with the chemistry;
   determining a volume of dilutant to deliver to the storage vessel through the fixed volume vessel to achieve the dilution ratio wherein the volume determination comprises determining a flow time for the dilutant into the fixed volume vessel; and
   directing delivery of the volume of dilutant to the storage vessel through the fixed volume vessel for the flow time.

15. The method of claim 14 wherein:
   determining the flow time for the dilutant into the fixed volume vessel is based on the flow rate of the dilutant so as to achieve the dilution ratio; and
   directing delivery of the volume of dilutant to the storage vessel through the fixed volume vessel comprises directing a flow of the dilutant to the storage vessel through the fixed volume vessel at the flow rate for the flow time.

16. The method of claim 14, further comprising draining the storage vessel before delivery of chemistry to the fixed volume vessel.

17. The method of claim 16 further comprising at least partially draining the storage vessel through the fixed volume vessel.

* * * * *